(12) United States Patent
Van der Zwan et al.

(10) Patent No.: US 6,404,367 B1
(45) Date of Patent: *Jun. 11, 2002

(54) SIGMA-DELTA MODULATOR WITH IMPROVED GAIN ACCURACY

(75) Inventors: Eric J. Van der Zwan; Eise C. Dijkmans, both of Eindhoven (NL)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/139,242

(22) Filed: Aug. 25, 1998

(30) Foreign Application Priority Data

Aug. 29, 1997 (EP) .............................. 97202657

(51) Int. Cl.[7] ................................. H03M 3/00
(52) U.S. Cl. ...................... 341/143; 341/155
(58) Field of Search .............. 341/143, 155, 341/110, 144

(56) References Cited

U.S. PATENT DOCUMENTS

| | | | | |
|---|---|---|---|---|
| 5,654,711 A | * | 8/1997 | Fujimori | 341/143 |
| 5,724,037 A | * | 3/1998 | Lee | 341/143 |
| 5,729,230 A | * | 3/1998 | Jensen et al. | 341/143 |
| 5,754,131 A | * | 5/1998 | Ribner et al. | 341/143 |
| 5,838,270 A | * | 11/1998 | Kiriaki | 341/143 |
| 5,907,299 A | * | 5/1999 | Green et al. | 341/143 |

FOREIGN PATENT DOCUMENTS

GB    2334638    *  2/1999    ............ H03M/3/02

OTHER PUBLICATIONS

"Integrated Analog–to–Digital and Digital–to–Analog Converters", By Rudy van de Plassche, Kluwer Academic Publishers, 1994, Chapter 11—Sigma–Delta Converters, pp. 413–451.

* cited by examiner

Primary Examiner—Peguy Jeanpierre

(57) ABSTRACT

Sigma-delta modulator in which the gain stage (20) of the input network and the gain stage (22) of the feedback network are regularly interchanged ("chopped"). This averages out the difference between the two gain stages, thus defining the gain of the system accurately. The difference in gain between the two gain stages is modulated on the chopping frequency, which may be outside the frequency band of interest. Furthermore, by using fully differential circuitry the chopping can be effected in such a manner that the offset and flicker noise of the two gain stages are modulated to the chopping frequency.

11 Claims, 3 Drawing Sheets

SIGMA-DELTA MODULATOR WITH IMPROVED GAIN ACCURACY

BACKGROUND OF THE INVENTION

The invention relates to a sigma-delta modulator for converting an analog input signal into a digital output signal, comprising:

an input network comprising a first gain stage for providing an amplified input signal in response to the analog input signal;

means for providing a difference signal in response to a comparison of the amplified input signal with an amplified feedback signal;

means for filtering the difference signal and for providing a filtered difference signal;

means for sampling and quantizing the filtered difference signal and having an output for providing the digital output signal;

a feedback network comprising a digital-to-analog converter for converting the digital output signal to an analog feedback signal and a second gain stage for providing the amplified feedback signal in response to the analog feedback signal.

Such a sigma-delta modulator (SDM) is generally known and described in books such as: Rudy van de Plassche, "*Integrated analog-to-digital and digital-to-analog converters*", Kluwer Academic Publishers, 1994, Chapter 11. Sigma-delta modulation is a technique in which an analog input signal is converted into a digital output signal having high resolution and low quantisation noise with the aid of oversampling by quantisation means having a low resolution and a high quantisation noise. The digital signal is reconverted to an analog feedback signal by means of a digital-to-analog converter having the same low resolution and is subtracted from the analog input signal in a subtracting stage. The difference between the two signals is filtered in an analog loop filter and applied to the quantisation means. The use of a sufficiently high loop gain for baseband frequencies of the analog signal achieves that in the digital output signal the quantisation noise within the baseband is low at the expense of a higher quantisation noise above this baseband. By means of digital filter techniques, however, noise above the baseband can be suppressed effectively, for example, by means of a decimating filter that converts the oversampled SDM digital output signal into a higher resolution (more bits) digital signal at the desired lower sampling rate.

FIG. 1 shows a block diagram of the SDM. The analog input signal X is amplified or buffered in an input network, the gain of which is represented by a first gain stage having a gain a. An analog feedback signal is subtracted from the input signal and the difference is filtered in a low-pass loopfilter G(f), sampled at a sampling rate $f_s$ and quantized by a quantizer Q, which may have a 1-bit or multi-bit resolution. In a feedback network the digital output signal $Y_s$ is reconverted to an analog feedback signal by means of a digital-to-analog converter DAC having the same resolution as the quantizer Q. The analog gain of the feedback network is represented as a second gain stage having a gain d. As will be shown hereinafter, for low frequency inputs (that is for frequencies much smaller than the sampling rate $f_s$) the signal gain is a/d. The quantization noise is "shaped" by the inverse of the loop-filter characteristic G(f).

For some uses, for example in instrumentation, the exact gain a/d of the SDM is important. However, due to mismatch between the gains of gain stages a and d the overall gain is not accurate and may deviate from the desired value, and the gaines may contain certain offsets, which differ from each other, so that the difference signal may have offset and distortion.

SUMMARY OF THE INVENTION

It is an object of the invention to provide an SDM with improved accuracy. To this end, the sigma-delta modulator as defined in the opening paragraph is characterized in that the sigma-delta modulator further comprises:

means for regularly interchanging the first gain stage and the second gain stage.

By regularly interchanging ("chopping") the first and second gain stages a and d the differences and further mismatches between both gain stages are modulated on the chopping frequency. The effective value of both gain stages becomes the average value of a and d so that the gain of the SDM is exactly unity. A high frequency ripple, at the chopping frequency, is present in the difference signal but the chopping frequency may be chosen outside the frequency band of interest, so that this ripple is of no importance.

Further improvements are obtained by using fully differential circuitry, preferably by using differential transconductors in the first and second gain stages. The subtraction of the input signal and the feedback signal can then easily be effected by interconnecting the opposite differential output signals of the transconductors.

BRIEF DESCRIPTION OF THE DRAWINGS

The above and other features and advantages of the invention will be apparent from the following description of exemplary embodiments of the invention with reference to the accompanying drawings, in which.

Like reference symbols are employed in the drawings and in the description of the preferred embodiments to represent the same or very similar item or items.

DESCRIPTION OF THE PREFERRED EMBODIMENTS

Figure 1:
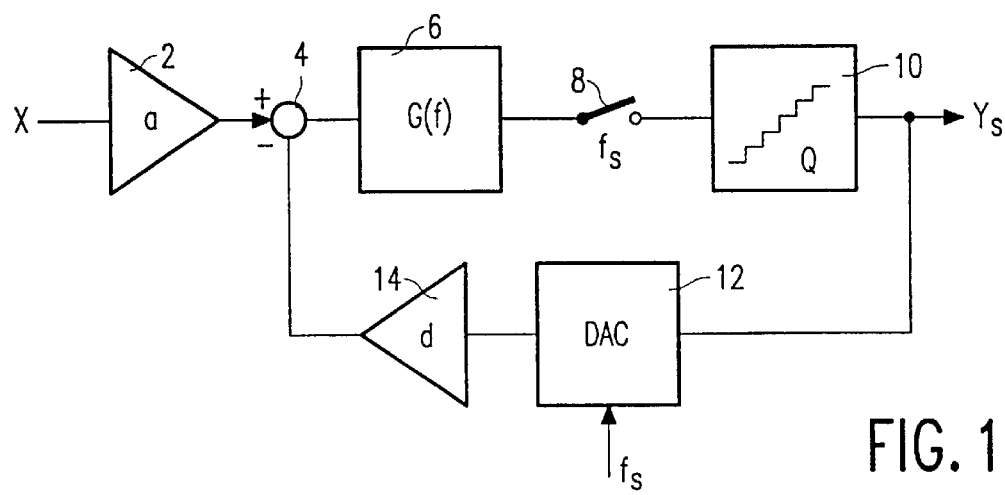
FIG. 1 is a circuit diagram of a conventional sigma-delta modulator.

FIG. 1 shows a circuit diagram of a conventional sigma-delta modulator (SDM). An analog input signal X is amplified or buffered in an input network, the gain of which is represented by a first gain stage 2 having a gain a. In a subtracter 4 an analog feedback signal is subtracted from the amplified or buffered input signal and the difference is filtered in a low-pass loopfilter 6 having a transfer characteristic G(f), is sampled by a sampler 8 at a sampling rate $f_s$ and is quantized by a quantizer 10, which may have a 1-bit or multi-bit resolution, and is output as a digital output signal $Y_s$. In a feedback network the digital output signal $Y_s$ is reconverted to an analog feedback signal by means of a digital-to-analog converter (DAC) 12 having the same resolution as the quantizer 10. The analog gain of the feedback network is represented as a second gain stage 14 having a gain d.

Figure 2:
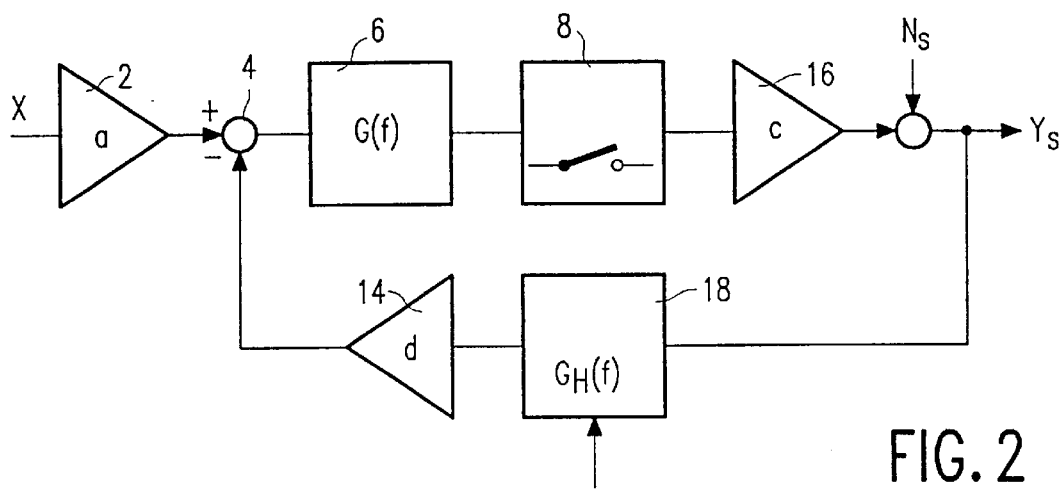
FIG. 2 is a circuit diagram of a linear model of the sigma-delta modulator of FIG. 1.

The SDM of FIG. 1 is usually modelled as shown in FIG. 2. The quantizer 10, which may have a 1-bit or multibit resolution, is modelled by a gain stage 16 having gain c and an additive white noise source $N_s$. The feedback DAC 12 can be modelled as a hold stage 18 and the gain stage 14 having a gain d. Note that the system of FIG. 2 is a mixed continuous-time/discrete-time system. Discrete-time signals are indicated by an index s, such as the digital output signal $Y_s$ and the additive noise $N_s$. The sampler 8 transforms its input signal from the continuous-time to the discrete-time domain. The frequency spectrum of the sampler output signal repeats with the sampling frequency. The hold function of hold stage 18 transforms its input signal from the discrete-time to the continuous-time domain. In the frequency domain the hold function is represented by a sinc filter GH(f), which has a low-pass characteristic with notches at multiples of the sampling frequency $f_s$. The digital output signal $Y_s$ of the SDM of FIG. 2 can be written as:

$$y_s(f) = \frac{a \cdot cG(f)}{1 + cdG(f)G_H(f)} X(f) + \frac{1}{1 + cdG(f)G_H(f)} \cdot N_s(f) \quad (1)$$

For low frequencies the hold function $G_H(f)$ has approximately unity gain, and since the loop filter G(f) is a low-pass filter so that cdG(f) >>1, equation (1) simplifies to $$Y_s(f) \approx \frac{a}{d} X(f) + \frac{1}{dG(f)} \cdot N_s(f) \quad (2)$$

For low frequency inputs, that is for frequencies much smaller than the sample rate $f_s$, the signal gain is.

$$\frac{a}{d}.$$

The noise is "shaped" by the inverse of the loop filter characteristic G(f).

For some uses, for example in instrumentation, the exact gain $$\frac{a}{d}$$

of the SDM is important. In order to obtain optimum matching of the gains a and d on an actual silicon implementation, it is wise to choose a as an integral multiple of d, or the other way around.

Figure 3:
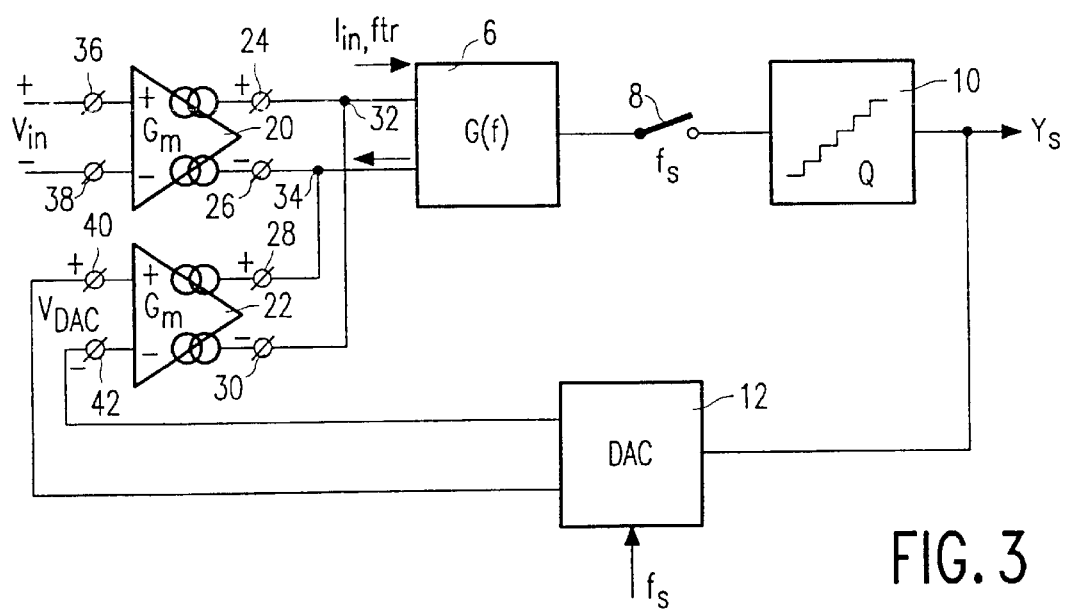
FIG. 3 is a circuit diagram of a conventional sigma-delta modulator using fully differential transconductors in the input network and the feedback network.

FIG. 3 shows an implementation where the first gain stage 2 and the second gain stage 14 are implemented by a fully differential input transconductor 20 and a fully differential feedback transconductor 22 having an equal transconductance $G_m$, so that the signal gain of the SDM is unity. The transconductor 20 has a positive input terminal 36 and a negative input terminal 38, a positive output terminal 24 and a negative output terminal 26, and the transconductor 22 has a positive input terminal 40, a negative input terminal 42, a positive output terminal 28 and a negative output terminal 30. The subtraction of the analog input signal and the feedback signal can now easily be effected by interconnecting, in a first node 32, the positive output terminal 24 of the input transconductor 20 to the negative output terminal 30 of the feedback transconductor 22, and by interconnecting, in a second node 34, the negative output terminal 26 of the input transconductor 20 to the positive output terminal 28 of the feedback transconductor 22. The resulting difference current flowing through the first and second nodes 32 and 34 forms the input current of the loop filter 6:

$$I_{in,ftr}=G_m(V_{in}-V_{DAC}) \quad (3)$$

wherein $V_{in}$ is the differential analog input signal at the differential input terminals 36 and 38 of the input transconductor 20 and $V_{DAC}$ is the differential feedback signal at the differential input terminals 40 and 42 of the feedback transconductor 22.

Due to a mismatch of the transconductors 20 and 22 the gain may deviate from unity. They may further contain certain offsets, which differ from each other, so that the difference current $I_{in,ftr}$ has offset and even harmonic distortion. Furthermore, asymmetry between the transconductors 20 and 22 is introduced if the input transconductor 20 has a single ended input signal (with the other input terminal connected to a reference voltage), whereas the feedback transconductor 22 is used differentially. This also creates offset and even harmonic distortion.

Figure 4:
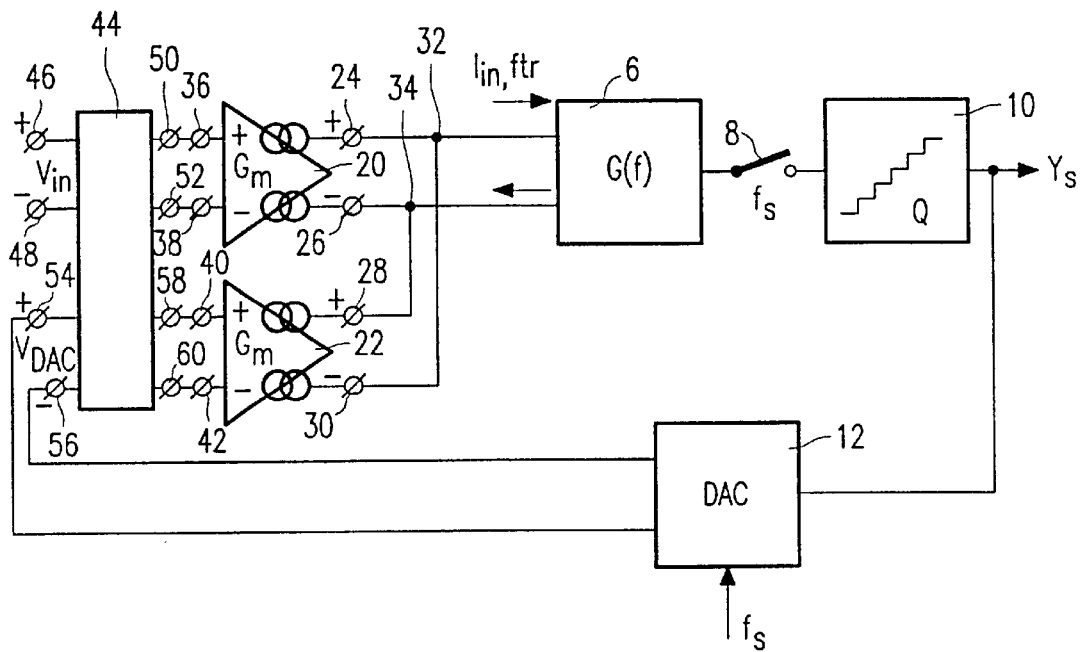
FIG. 4 is a circuit diagram of a first embodiment of a sigma-delta modulator according to the invention.

FIG. 4 shows the same SDM configuration of FIG. 3, but extended with a switching circuit 44. The switching circuit 44 has a positive input terminal 46 and a negative input terminal 48 for receiving the differential input voltage $V_{in}$, and output terminals 50 and 52 connected to, respectively, the positive input terminal 36 and the negative input terminal 38 of the input transconductor 20. The switching circuit 44 further has a positive input terminal 54 and a negative input terminal 56 for receiving the differential feedback voltage $V_{DAC}$, and output terminals 58 and 60 connected to, respectively, the positive input terminal 40 and the negative input terminal 42 of the feedback transconductor 22.

By regularly interchanging ("chopping") the transconductors 20 and 22 by means of the switching circuit or chopper 44, the differences between both transconductors are modulated on the chopping frequency. The effective value of the transconductance of both transconductors becomes the average value $G_{m,a}$ and $G_{m,b}$, so that the gain of the SDM is exactly unity. A high frequency ripple (at the chopping frequency) is present in the difference current $I_{in,ftr}$, but the chopping frequency may be chosen outside the frequency band of interest, so that this ripple is of no importance. Because a subtraction has to be performed the output terminals of the transconductors 20 and 22 are crosscoupled in the same manner as shown in FIG. 3.

In order to preserve the correct phase of the difference current $I_{in,ftr}$, the chopping has to be performed in the following way:

During the first half of the chopping clock period, the positive input terminal 46 is connected to output terminal 50, the negative input terminal 48 to the output terminal 52, the positive input terminal 54 to the output terminal 58 and the negative input terminal 56 to the output terminal 60.

During the second half of the chopping clock period, the positive input terminal 46 is connected to the output terminal 60, negative input terminal 48 to the output terminal 58, the positive input terminal 54 to the output terminal 52 and the negative input terminal 56 to the output terminal 50.

Figure 5:
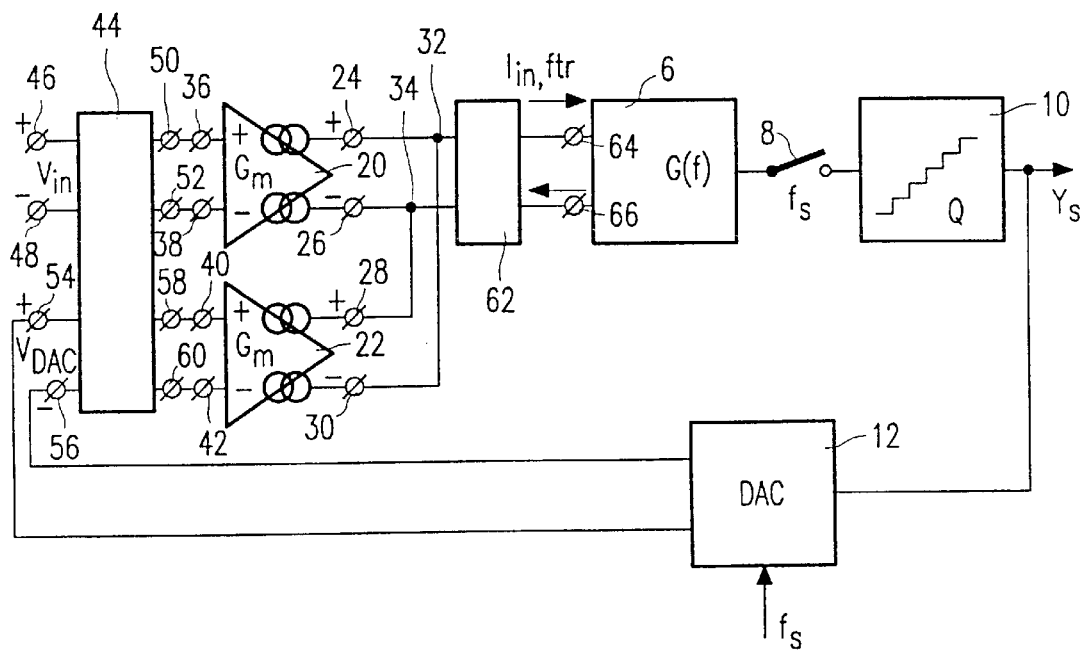
FIG. 5 is a circuit diagram of a second embodiment of a sigma-delta modulator according to the invention.

In order to reduce offsets, and even harmonic distortion and flicker noise, the chopping process can be extended by adding a second chopper 62 between the nodes 32 and 34 and the input terminals 64 and 66 of the loop filter 6. This is shown in FIG. 5. The second chopper 62 interchanges the subtracted output signals of the transconductors 20 and 22. In order to preserve the correct phase of the difference current $I_{in,ftr}$, the chopping has to be performed in the following way in this case:

During the first half of the chopping clock period, the positive input terminal 46 is connected to the output terminal 50, the negative input terminal 48 to the output terminal 52, the positive input terminal 54 to the output terminal 58 and the negative input terminal 56 to the output terminal 60. Furthermore, by means of the second chopper 62, the first node 32 is connected to the input terminal 64 and the second node 34 is connected to the input terminal 66.

During the second half of the chopping clock period, the positive input terminal 46 is connected to the output terminal 58, the negative input terminal 48 to the output terminal 60, the positive input terminal 54 to the output terminal 50 and the negative input terminal 56 to the output terminal 52. Furthermore, by means of the second chopper 62, the first node 32 is connected to the input terminal 66 and the second node 34 is connected to the input terminal 64.

Figure 6:
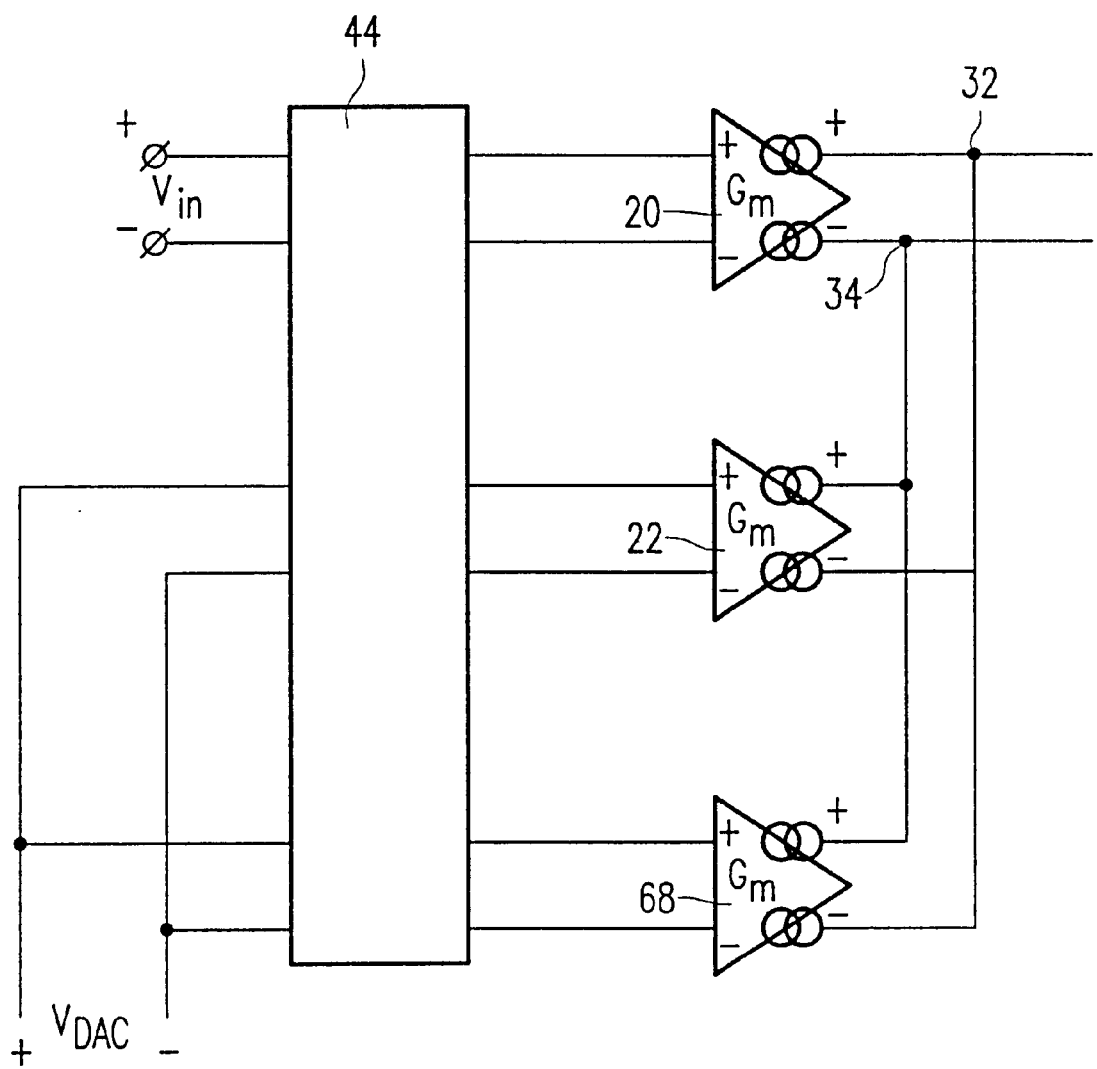
FIG. 6 is a circuit diagram of a part of a third embodiment of a sigma-delta modulator according to the invention.

By adding one or more further transconductors having the same transconductance $G_m$ with parallel to the feedback transconductor 22 an overall gain other than unity can be obtained. FIG. 6 shows an example in which a second feedback transconductor 68 is added. The corresponding output terminals of the transconductors 22 and 68 are interconnected, thus providing a total transconductance $2G_m$ in the feedback network. Both transconductors 22 and 68 receive the differential feedback voltage $V_{DAC}$ from the DAC 12. The switching circuit 44 is extended with a further set of positive and negative input terminals connected to the differential feedback voltage $V_{DAC}$ and with a further set of output terminals connected to the input terminals of the second feedback transconductor 68. The chopping period is now divided in three periods in which the three transconductors 20, 22 and 68 are cyclically interchanged. Alternatively it is possible to add one or more transconductors in parallel with the input transconductor 20.

What is claimed is:

1. A method for converting an analog input signal into a digital output signal, comprising the steps of:
   providing an amplified input signal based on an analog input signal, using a first gain stage in an input network;
   comparing the amplified input signal with an amplified feedback signal to provide a difference signal;
   process the difference signal to provide the digital output signal based on the difference signal;
   converting the digital output signal to an analog feedback signal;
   providing the amplified feedback signal based on the analog feedback signal, using a second gain stage in a feedback network; and
   regularly interchanging the first gain stage and the second gain stage, so as to allow the first gain stage to be used in the feedback network in place of the second gain stage and the'second gain stage to be used in the input network in place of the first gain stage.

2. The method of claim 1, wherein the step of interchanging means comprises the step of regularly switching connections between the analog input signal and the amplified feedback signal and inputs of the first and second gain stages.

3. The method of claim 1, wherein the first and second gain stages each comprise a differential transconductor having an inverting output terminal and a non-inverting output terminal, the inverting output terminal of the differential transconductor in the first gain stage and the non-inverting output terminal of the differential transconductor in the second gain stage are connected to provide a first subtracted signal, and
   wherein the non-inverting output terminal of the differential transconductor in the first gain state and the inverting output terminal of the differential transconductor in the second gain stage are connected to provide a second subtracted signal
   wherein the difference signal comprises the first and second subtracted signals.

4. The method of claim 3, further comprising the steps of:
   applying the first and second subtracted signals to a filter circuit for processing; and
   interchanging the first and second subtracted signals.

5. sigma-delta modulator comprising:
   a filter that is configured to receive a combination of an input signal and a feedback signal, and produces therefrom a filtered signal,
   a quantizer that is configured to sample the filtered signal and to produce therefrom a quantized sample,
   a converter that is configured to receive the quantized sample and to produce therefrom the feedback signal, and
   a switching amplifier that is configured to receive the input signal and the feedback signal and to produce therefrom the combination of the input signal and the feedback signal, wherein
   the switching amplifier includes:
      a first gain stage that is configured to receive the input signal during a first time interval and the feedback signal during a second time interval, and
      a second gain stage that is configured to receive the feedback signal during the first time interval and the input signal during the second time interval, and
   the combination of the input signal and the feedback signal includes outputs of the first gain stage and the second gain stage.

6. The sigma-delta modulator of claim 5, wherein the switching amplifier further includes
   a switching that is configured to:
      couple the input signal to the first gain stage and the feedback signal to the second gain stage, at the first time interval, and
      couple the input signal to the second gain stage and the feedback signal to the first gain stage, at the second time interval.

7. The sigma-delta modulator of claim 6, wherein
   the first gain stage includes a first differential amplifier,
   the second gain stage includes a second differential amplifier, and
   the combination of the input signal and the feedback signal includes differential outputs of the first and second differential amplifiers.

8. The sigma-delta modulator of claim 7, wherein
   the combination of the input signal and the feedback signal includes a differential signal having a first phase and a second phase,
   the sigma-delta modulator further including
      an other switching amplifier that is configured to exchange the first phase and the second phase of the differential signal.

9. The sigma-delta modulator of claim 7, wherein the switching amplifier includes a third gain stage that is configured to receive the input signal during a third time interval and the feedback signal during the first and second time intervals, the combination of the input signal and the feedback signal further includes a differential output of the third gain stage.

10. The sigma-delta modulator of claim 5, wherein the switching amplifier includes a third gain stage that is configured to receive the input signal during a third time interval and the feedback signal during the first and second time intervals, the combination of the input signal and the feedback signal further includes an output of the third gain stage.

11. The sigma-delta modulator of claim 5, wherein the combination of the input signal and the feedback signal includes a differential signal having a first phase and a second phase, the sigma-delta modulator further including an other switching amplifier that is configured to exchange the first phase and the second phase of the differential signal.

* * * * *